(12) United States Patent
McCarroll et al.

(10) Patent No.: US 6,359,467 B1
(45) Date of Patent: Mar. 19, 2002

(54) DYNAMIC ELEMENT MATCHING USING CURRENT-MODE BUTTERFLY RANDOMIZATION

(75) Inventors: Benjamin J. McCarroll; Rie Sasakawa, both of Portland, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/684,564

(22) Filed: Oct. 5, 2000

(51) Int. Cl.[7] .................................................. G06F 7/38
(52) U.S. Cl. .............................. 326/37; 326/43; 326/42; 326/44; 326/126; 326/127
(58) Field of Search ................................ 326/37, 42–45, 326/47–50, 115, 126, 127

(56) References Cited

U.S. PATENT DOCUMENTS 5,391,941 A * 2/1995 Landry ........................ 326/106
6,208,166 B1 * 3/2001 Carro ........................... 326/59

OTHER PUBLICATIONS

Carley, L. Richard, "A Noise–Shaping Coder Topology for 15+ Bit Converters", IEEE Journal of Solid–State Circuits, vol. 24, No. 2, Apr. 1989, pp. 267–273.

* cited by examiner

Primary Examiner—Michael Tokar
Assistant Examiner—Anh Tran
(74) Attorney, Agent, or Firm—Blakely, Sokoloff, Taylor & Zafman LLP

(57) ABSTRACT

The present invention is a technique for dynamic element matching used in digital-to-analog converters (DAC's). An analog-to-digital converter (ADC) converts an analog signal into a digital code. A current-mode randomizer randomizes the digital code based on a control word provided by a pseudo random number generator. A digital-to-analog converter (DAC) converts the randomized digital code into an analog signal.

16 Claims, 5 Drawing Sheets

DYNAMIC ELEMENT MATCHING USING CURRENT-MODE BUTTERFLY RANDOMIZATION

BACKGROUND OF THE INVENTION

1. Field of the Invention

This invention relates to data conversion. In particular, the invention relates to dynamic element matching circuits.

2. Description of Related Art

Fast analog-to-digital converters often use a pipeline approach in which several stages of conversion are cascaded, each with a smaller number of bits. Each stage includes an analog-to-digital converter followed by a digital-to-analog converter.

Digital-to-analog converters tend to generate errors correlated to the digital input. These errors are typically the result of component mismatches, process and thermal gradients, and other non-linear error sources. These errors may create harmonic distortion that causes undesirable effects to the conversion process. Methods to reduce these errors include selecting high quality components, and trimming component values and parameters. However, these methods are expensive and difficult to implement. Dynamic element matching was first proposed by Rudy Van de Plassche in the 1970's. More recent articles have appeared in the Journal of Solid State Circuits by Carley and others where the technique is most often used in sigma-delta converters with multi-bit quantizers where linearity is not inherent.

BRIEF DESCRIPTION OF THE DRAWINGS

The features and advantages of the present invention will become apparent from the following detailed description of the present invention in which.

DETAILED DESCRIPTION OF THE PREFERRED EMBODIMENT

The present invention comprises current-mode randomizers for dynamic element matching in digital-to-analog converters (DAC's). An analog-to-digital converter (ADC) converts an analog signal into a digital code. A randomizer randomizes the digital code based on a control word provided by a pseudo-random number generator. A digital-to-analog converter (DAC) converts the randomized digital code into an analog signal. The technique provides an efficient means to reduce errors causing signal distortion.

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

Dynamic matching is used to improve the average linearity of the DAC. For a given thermometer code, the one's are "spread around" in a random fashion so that the errors in the DAC currents are averaged together. Theoretically, if the spreading is ideal and enough time is allowed to average the current elements, the DAC becomes perfectly linear. In effect, the energy that is normally concentrated at harmonic frequencies becomes white noise, somewhat raising the noise floor while significantly improving the total harmonic distortion and spurious free dynamic range.

An example is shown below. A thermometer code of four is randomized seven different times. Note that the sum of ones is always four and that the probability of one of the ones falling in any one of seven locations is 1/7.

| Original Code   | 0001111 |
| --------------- | ------- |
| Randomization 1 | 1010110 |
| Randomization 2 | 0101011 |
| Randomization 3 | 1010101 |
| Randomization 4 | 1100110 |
| Randomization 5 | 0011101 |
| Randomization 6 | 1011001 |
| Randomization 7 | 1100011 |

When taking a Fast Fourier Transform (FFT) with ideal, N-BIT ADC (or DAC), the power spectral density of the quantization noise is given by the following:

Quantization Noise Floor=6.02*N+3.01*M−1.25 in dB where M is the $\log_2$(Record Length). For example, if N=6 and M=16, then the average quantization noise floor is 83.0 dB. The power spectral density can be estimated by averaging the powers of several FFT's together.

Figure 1:
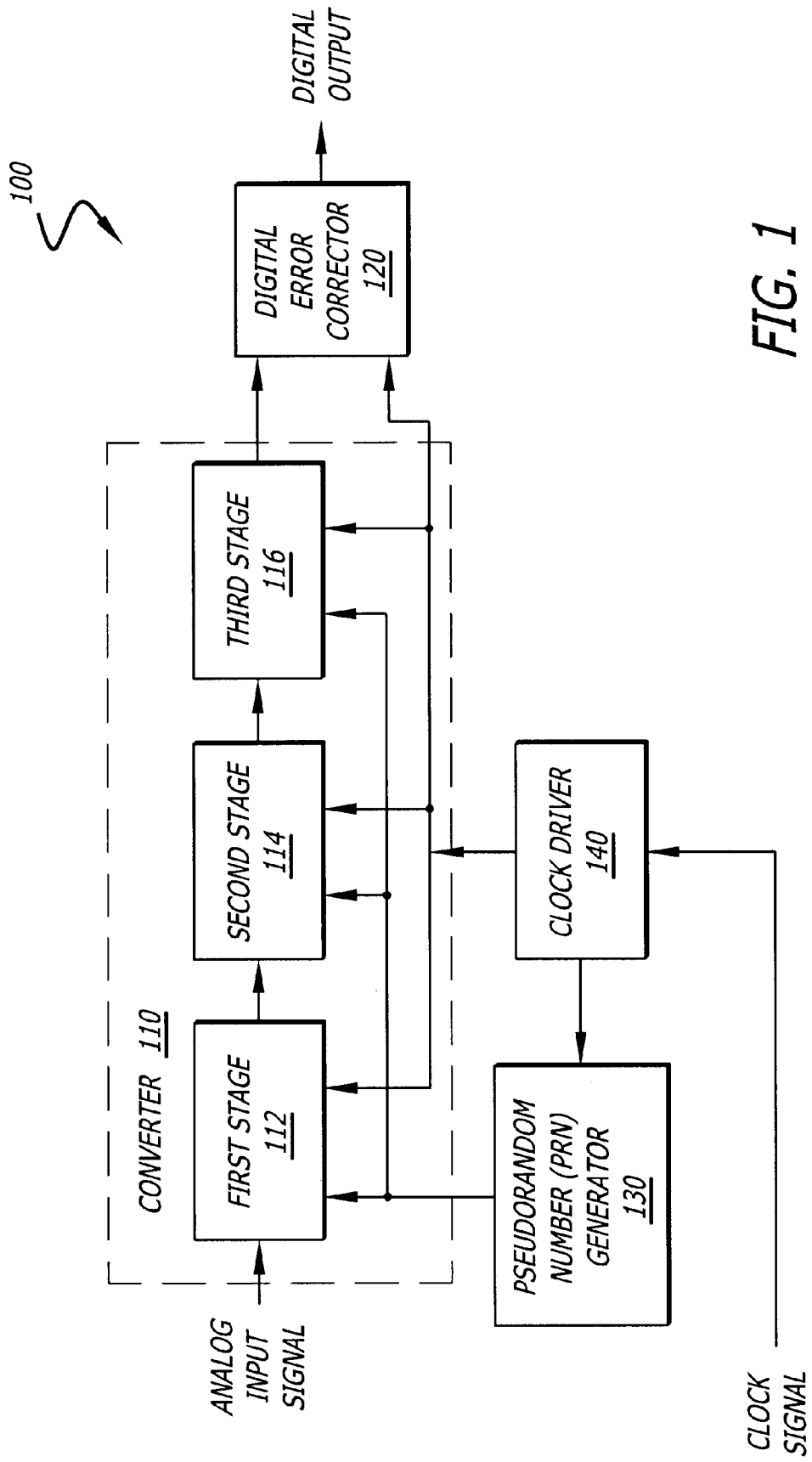
FIG. 1 is a diagram illustrating an analog-to-digital subsystem in which one embodiment of the invention can be practiced.

FIG. 1 is a diagram illustrating an analog-to-digital subsystem 100 in which one embodiment of the invention can be practiced. The analog-to-digital subsystem 100 includes a converter 110, a digital error corrector 120, a pseudo-random number (PRN) generator 130, and a clock driver 140.

The converter 110 converts an analog input signal into a digital word having N-bit resolution. The converter 110 has three circuit stages, a first stage 112, a second stage 114, and a third stage 116. The three circuit stages operate in a pipeline fashion with one bit of overlap between the stages for digital error correction. In one embodiment, the resolution per stage is 5-5-6 bits resulting in a 4+4+6=14 bits total.

The digital error corrector 120 is used to appropriately re-time the outputs of the various quantizers in the converter 110, and to adjust the results of the quantizers with adjusted values. The pseudo-random number generator 130 generates a random word to control various elements in the converter 110. In one embodiment, the pseudo-random number generator generates 17-bit element with 131,071 states. The number of states may be a prime number. The 17 elements can be configured as a pseudo-random number generator using an exclusive-or gate as feedback. The clock driver 140 is used to sharpen the edges of an input clock signal and to drive various circuit elements in the subsystem, such as track-and-hold (TH) devices, DACs, etc.

Figure 2:
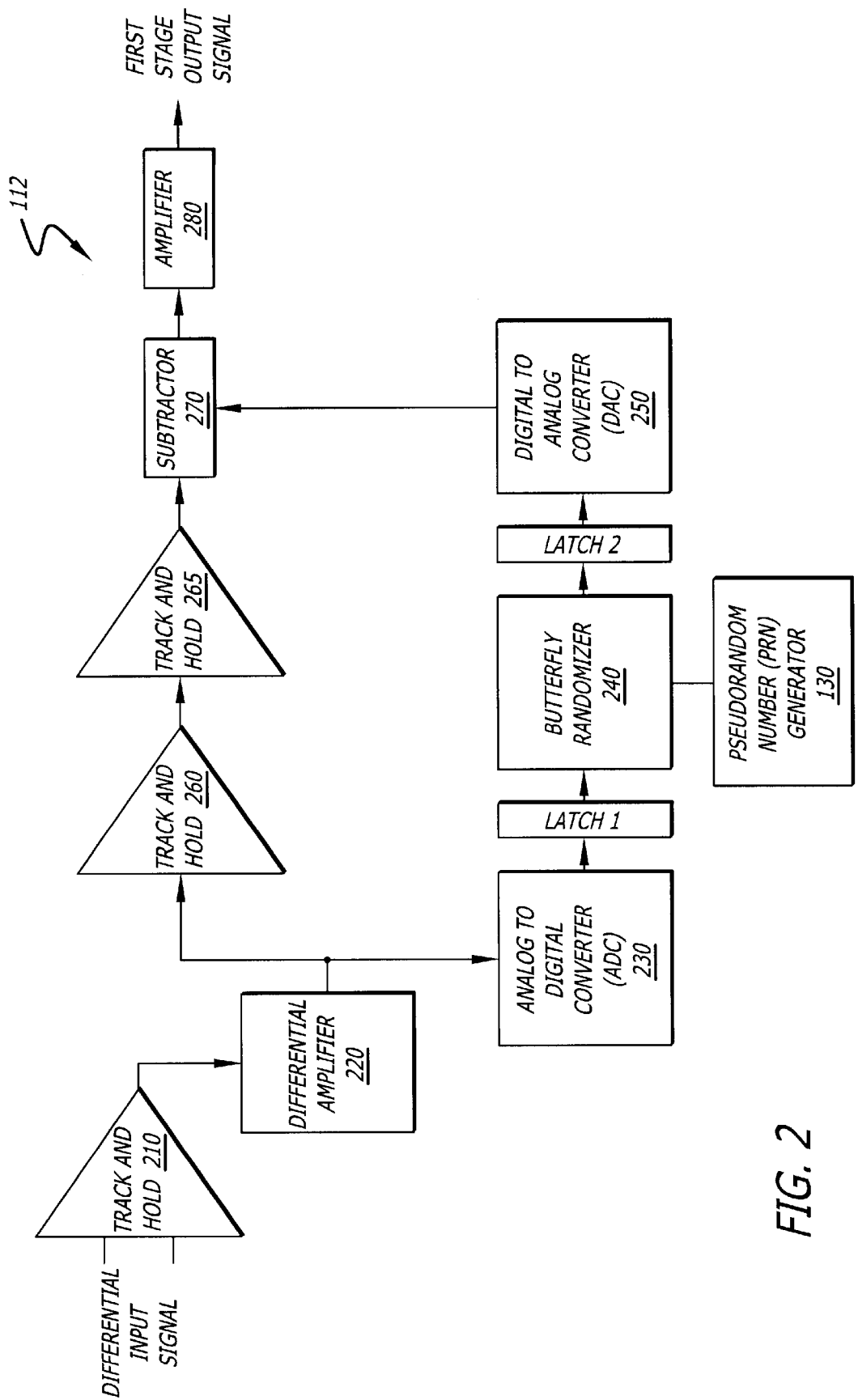
FIG. 2 is a diagram illustrating a first stage circuit shown in FIG. 1 according to one embodiment of the invention.

FIG. 2 is a diagram illustrating the first stage circuit 112 shown in FIG. 1 according to one embodiment of the invention. The first stage circuit 112 includes a track-and-hold (TH) device 210, a differential amplifier 220, an ADC 230, a latch 1, a randomizer 240, a pseudo-random number generator 130, a latch 2, a DAC 250, two track-and-hold devices 260 and 265, a subtractor 270, and an amplifier 280.

The track-and-hold device 210 samples the continuous analog input signal and holds it while the ADC estimates the sampled input. This estimate goes to the digital error corrector 120 shown in FIG. 1. The amplifier 220 amplifies the sampled input signal for further processing. In one embodiment, the gain of the amplifier 220 is approximately two. The amplifier 220 may be a differential or single-ended amplifier. The input common mode is typically ground.

The ADC 230 converts the analog signal output from the differential amplifier 220 into a thermometer code. The randomizer 240 performs a bit permutation or swapping on the thermometer code using the control signal from the pseudo-random number generator 130 (see also FIG. 1). The DAC 250 converts the randomized thermometer code into an analog signal. Due to component mismatches, the DAC 250 may generate errors correlated to the analog input. These correlated errors cause spurious components that are often undesirable. The function of the randomizer 240 is to reduce the correlation between the analog input and the DAC error.

The randomizer has the same number of inputs and outputs. For a given control signal, each input will be routed to a particular output. In other words, the control signal determines the mapping from input to output. Therefore, the number of 1's and 0's are the same at the input and output, but the distribution of 1's and 0's for a given input change at the output depending on the control signal. A new control signal is usually generated each clock cycle.

For example, assume an 8-input randomizer has one 1 and seven 0's at the input. If the randomizer is designed properly and if the control signal is sufficiently random, the probability that any one of the outputs is 1 for a given clock cycle is 1/8. Then, if used to drive an 8-state thermometer-code DAC, the average of 8 currents sources determines the average DAC output versus a single current source in the non-randomized case. The following example shows 6 clock cycles where the input is always 0000 0001.

| Clock | Thermometer Code Input | Randomized Thermometer Code Output |
|---|---|---|
| 1 | 00000001 | 00000001 |
| 2 | 00000001 | 01000000 |
| 3 | 00000001 | 00010000 |
| 4 | 00000001 | 00000010 |
| 5 | 00000001 | 10000000 |
| 6 | 00000001 | 00100000 |

The randomizer 240 essentially pseudo-randomly scatters "the mercury" in the thermometer codes so that for a given number at the input, the sum of ones at the output will equal the sum of ones at the input but the distribution of the output ones varies pseudo-randomly for each clock cycle. By randomly selecting DAC elements, non-linearities due to mismatch, process gradients, thermal gradients, etc. are effectively converted from harmonic distortion into pseudo-random noise.

By using multiple 8-input randomizers, even larger thermometer DAC's may implement dynamic element of matching. For example, by using eight 8-input randomizers, 64 thermometer codes are possible resulting in a 6-bit DAC. Of course, each input cannot go to each output, but the resulting randomization is typically adequate to reduce the correlation between the DAC error and the input code so that the harmonic distortion due to component mismatch is significantly reduced.

Figure 3:
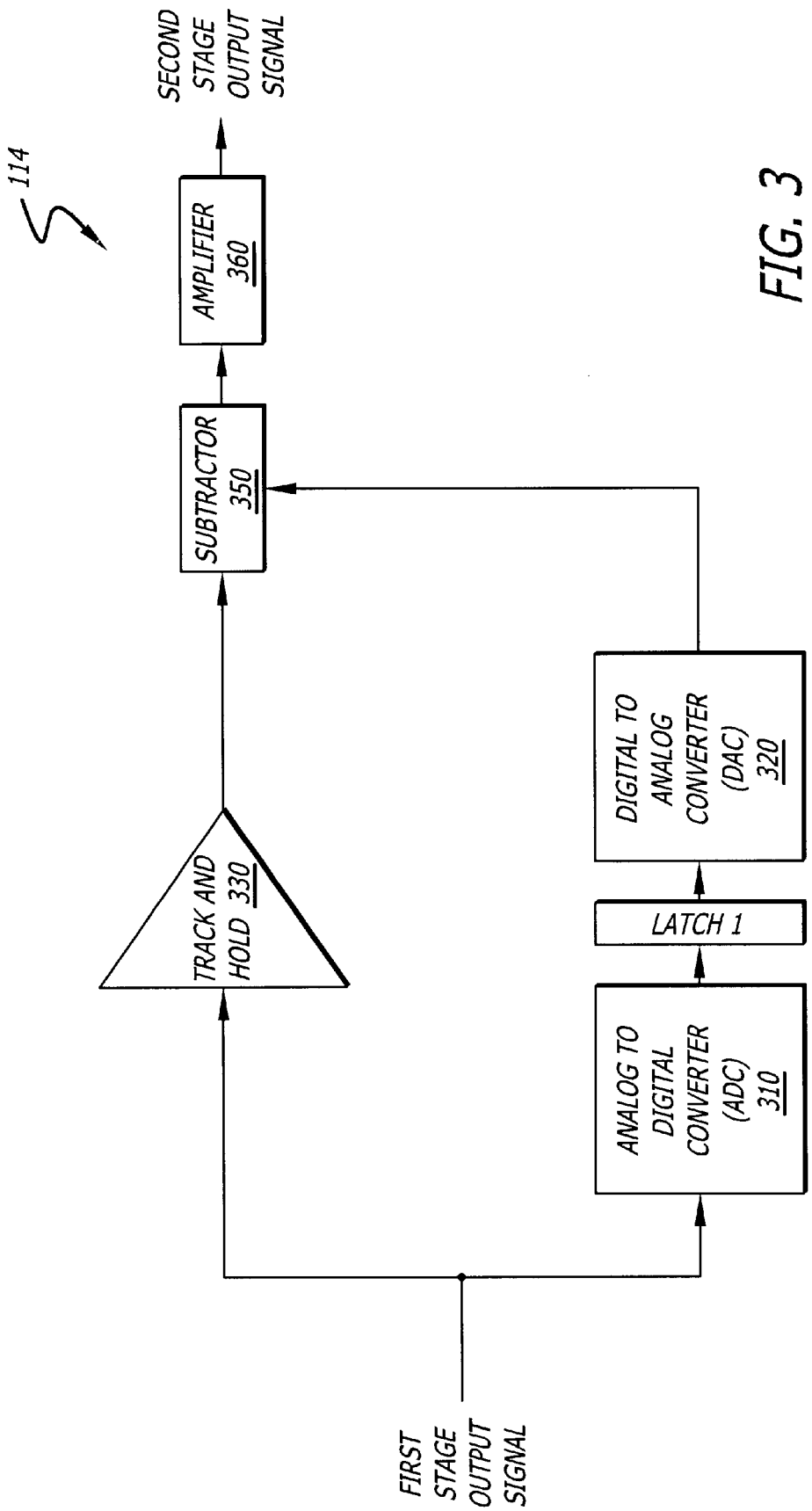
FIG. 3 is a diagram illustrating a second stage circuit shown in FIG. 1 according to one embodiment of the invention.

FIG. 3 is a diagram illustrating the second stage circuit 114 shown in FIG. 1 according to one embodiment of the invention. The second stage circuit 114 includes an ADC 310, a latch, a DAC 320, a track-and-hold device 330, a subtractor 350, and an amplifier 360. The second stage circuit 114 generates a second stage output signal.

The ADC 310 converts the first stage output signal into a digital word that is converted into an analog signal by the DAC 320. In order to maintain good matching, the DAC 320 is also implemented using thermometer codes. The track-and-hold device 330 samples the first stage output signal and provides appropriate delay. The subtractor 350 subtracts the output of the DAC 320 from the output of the track-and-hold device 330. The amplifier 360 amplifies the residue output of the subtractor 350 and generates the second stage output signal.

Figure 4:
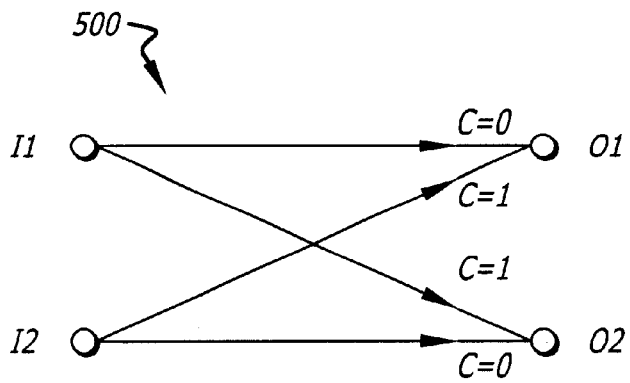
FIG. 4 is a diagram illustrating a 2-input butterfly.

FIG. 4 is a diagram illustrating the butterfly 500 according to one embodiment of the invention. The butterfly 500 is a basic butterfly switching unit to be used in the randomizer 240 shown in FIG. 2. The butterfly 500 has two input I1 and I2, and two outputs O1 and O2.

The inputs I1 and I2 are mapped into the output O1 and O2 according to a control bit, C. In one embodiment, when C is equal to 0, the input I1 and I2 are mapped into the outputs O1 and O2, respectively. When C is equal to 1, the inputs I1 and I2 are mapped to the outputs O2 and O1, respectively. The butterfly 500 operates like the butterfly permutation or swapping used in the signal flow graph of the Fast Fourier Transform (FFT), thereby the name butterfly.

The butterfly 500 can be implemented by switching currents, not voltages, because this is an advantageous way to implement this function with bipolar processes.

Figure 5:
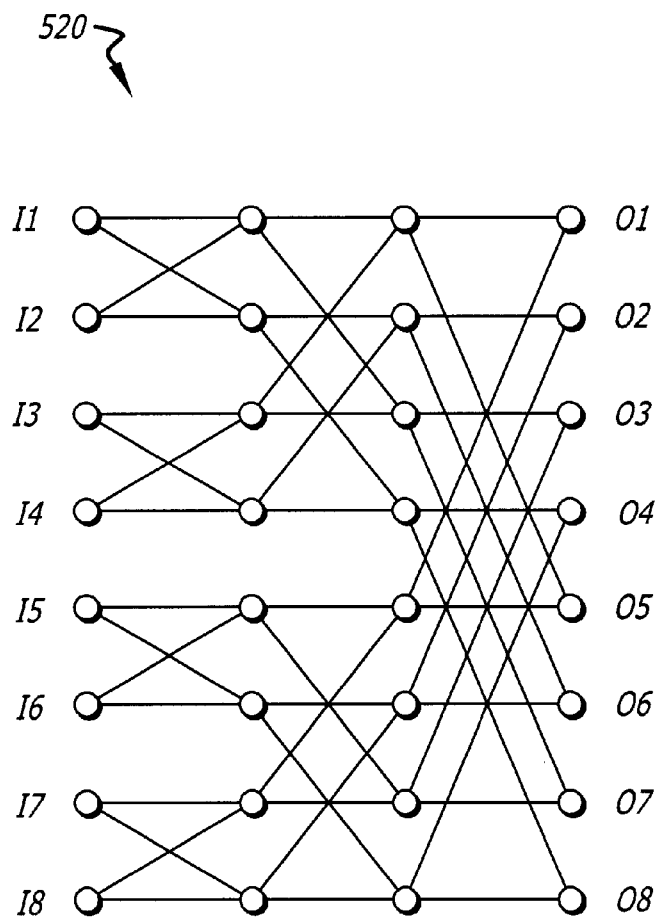
FIG. 5 is a diagram illustrating an 8-input butterfly.

FIG. 5 is a diagram illustrating an 8-input butterfly 520 according to one embodiment of the invention. The butterfly switching circuit 520 has eight inputs and eight outputs.

The eight inputs I1 through I8 are mapped into the eight outputs O1 through O8 via three stages. Each stage has four basic butterfly units, requiring four control signals. The total number of control signals for the eight input switching circuit 520 is, therefore, twelve. Any of the inputs I1 through I8 can be mapped into any of the outputs O1 through O8 by applying appropriate control signals to the corresponding butterfly units.

Figure 6:
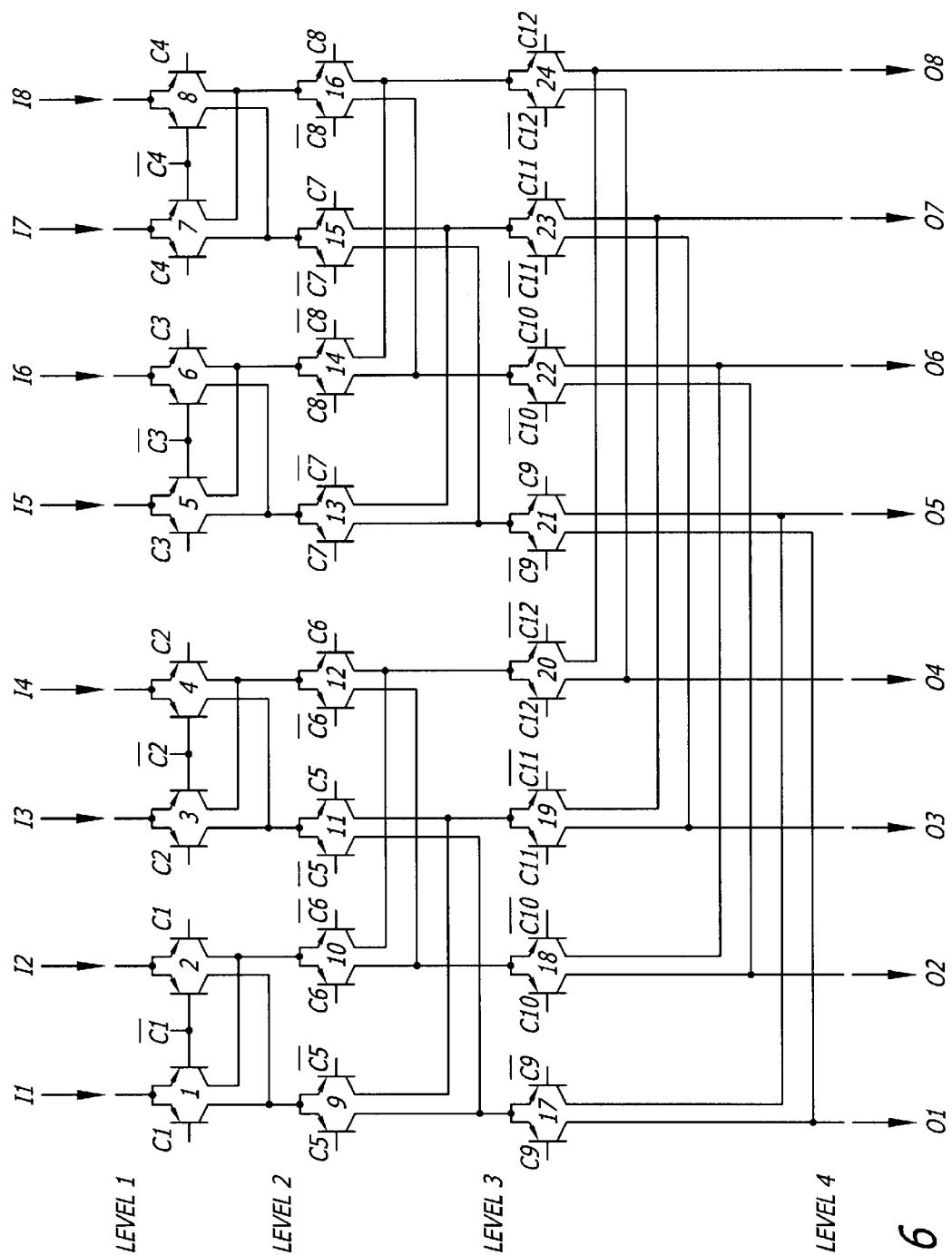
FIG. 6 is a circuit diagram of an 8-input current-mode butterfly according to one embodiment of the invention.

An exemplary current-mode randomizer implementing the 8-input butterfly of FIG. 5 may be seen in FIG. 6. This randomizer is comprised of 24 current steering circuits 1 through 24. Each steering circuit comprises a pair of pnp transistors in a common emitter configuration. Four levels of currents are identified in the Figure, level 1 being the input or unrandomized currents, level 2 being the output of the first stage of current steering circuits 1 through 8, level 3 being the output of the second stage of current steering circuits 9 through 16, and level 4 being the randomized output of the third stage of current steering circuits 17 through 24. In this exemplary embodiment, each of the eight inputs I1 through I8 is coupled to a respective current steering circuit 1 through 8. Each pair of current steering circuits 1–2, 3–4, 5–6 and 7–8 are driven by complementary control signals C1-$\overline{C1}$ through C4-$\overline{C4}$, respectively.

In the exemplary embodiment, the input currents have two states, a one state being a predetermined current level, and the other current state being no current. In the embodiment shown in FIG. 6, if the control C1 is low, the left transistor of current steering circuit 1 and the right transistor of current steering circuit 2 will be turned on, so that the input currents I1 and I2 will be passed directly to level 2. If the control C1 is high, the right transistor of current steering circuit 1 and the left transistor of current steering circuit 2 will be turned on, so that the input currents I1 and I2 will be swapped at level 2, etc.

The second stage of current steering circuits 9 through 16, and the third stage of current steering circuits 17 through 24 operate similarly to the first stage of current steering circuits. However, pairs of current steering circuits of the second stage will pass the respective pair of level 2 currents to level 3, or will swap the respective level 2 currents 2 positions away. Pairs of current steering circuits of the third stage will pass the respective pair of level 3 currents to level 4 (the randomizer output), or will swap the respective level 3 currents 4 positions away. Consequently any one input current I1 through I8 can be shifted to any output position O1 through O8 by passing the respective current directly to the output or shifting it by one, a combination of, or all of the three stages of the current steering circuits.

It should be noted that preferably, as in the exemplary embodiment, the pairs of current steering circuits in the various stages of the randomizer controllably shift the currents $2^n$ positions, where N=the number of stages in the randomizer and $0 \leq n \leq N-1$. However, the order of the stages is inconsequential, as in the exemplary embodiment, they could just as well be arranged to shift 2, then 4, then 1 position, or 4, 2 then 1, as opposed to the 1, 2, 4 order of the stages of the exemplary embodiment.

The complementary control signals C1-$\overline{C1}$ through C12-$\overline{C12}$ in the exemplary embodiment are differential signals with a range of approximately ±250 millivolts, each stage of current steering circuits having its transistors operating in the forward active region (not in saturation) and having a common mode input voltage to provide proper biasing of the transistors. While pnp transistors are preferred, since the DAC is comprised of npn's for fast settling, current-mode randomizers in accordance with the present invention may readily be realized using npn transistors, or p-channel or n-channel MOS transistors. Similarly, a single ended input for the control signals C1 through C12 may be used if desired, coupling the second input to each current steering circuit to an appropriate reference voltage for that stage of the randomizer. Also, a differential, current-mode randomizer is possible by using two of the randomizers of FIG. 6 in parallel, one randomizing the "positive" currents and the other the "negative" currents. Further, by using multiple 8-input randomizers, even larger thermometer DAC's may implement dynamic element matching. For example, by using eight 8-input randomizers, 64 thermometer codes are possible, resulting in a 6-bit DAC. Of course, each input cannot go to each output, but the resulting randomization is typically adequate to reduce the correlation between the DAC error and the input code so that the harmonic distortion due to component mismatch is significantly reduced.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A butterfly randomizer comprising:
   a current-mode randomizer having;
   a first plurality of current inputs;
   a second plurality of current outputs equal in number to the first plurality of current inputs;
   a third plurality of control signal inputs;
   a fourth plurality of current steering circuits arranged in stages, each stage having a plurality of the current steering circuits equal in number to the first plurality and arranged in pairs, a first stage of current steering circuits coupled to the first plurality of current inputs, each pair of current steering circuits in the first stage either directly passing or swapping the respective pair of current inputs to a next stage responsive to a respective one of the plurality of control signals;
   a last stage of current steering circuits coupled to the plurality of current steering circuits of a preceding stage, each pair of current steering circuits in the last stage either directly passing or swapping the respective pair of currents from the preceding stage to the current outputs; and,
   any intervening stages of current steering circuits being coupled to the plurality of current steering circuits of a preceding stage, each pair of current steering circuits in any intervening stages either directly passing or swapping the respective pair of currents from the preceding stage to a subsequent stage.

2. The butterfly randomizer of claim 1 wherein each pair of current steering circuits in each stage swaps the respective pair of currents a different number of positions than each other pair of current steering circuits in each other stage.

3. The butterfly randomizer of claim 2 wherein each stage swaps the respective pair of $2^n$ positions, where N=the number of stages in the randomizer and $0 \leq n \leq N-1$.

4. The butterfly randomizer of claim 1 wherein the first plurality is 8, the third plurality is 12 and the number of stages is 3.

5. The butterfly randomizer of claim 1 wherein the current steering circuits comprise common emitter connected pnp transistors.

6. The butterfly randomizer of claim 5 wherein each control signal input comprises a differential control signal input, the differential control signal inputs for each stage having a predetermined common mode voltage.

7. The butterfly randomizer of claim 1 further comprised of a pseudo-random number generator coupled to provide the control signal inputs.

8. The butterfly randomizer of claim 1 wherein the current steering circuits are differential current switching circuits.

9. A method of implementing a butterfly randomizer comprising:
   (a) providing an even first plurality of currents, each having one of a first and a second current state;
   (b) selectively and controllably swapping pairs of the currents, each responsive to a respective control signal to provide a second plurality of currents equal in number to the first plurality; and,
   (c) selectively and controllably swapping pairs of the second plurality of currents at least one more time, each responsive to a respective control signal to provide as randomized current outputs, a third plurality of currents equal in number to the first plurality.

10. The method of claim 9 wherein each time pairs of the currents are selectively and controllably swapped in (b) and (c), each pair of currents that is swapped is swapped a different number of positions.

11. The method of claim 10 wherein each time pairs of the currents are selectively and controllably swapped in (b) and (c), each pair of currents that is swapped is $2^n$ positions, where N=the number of times pairs of the currents are selectively and controllably swapped and $0 \leq n \leq N-1$.

12. The butterfly randomizer of claim 9 wherein the first plurality is 8, the number of control signals is 12 and the number of times pairs of the currents are selectively and controllably swapped is 3.

13. The method of claim 9 wherein the pairs of the currents are selectively and controllably swapped using common emitter connected pnp transistor steering circuits.

14. The method of claim 13 wherein the pnp transistor steering circuits are controlled by differential control signal inputs.

15. The method of claim 9 wherein the control signals are obtained from a pseudo-random number generator.

16. The method of claim 9 wherein the selectively and controllably swapping of pairs of the currents is accomplished using differential current switching circuits.

* * * * *